(12) United States Patent
Mateosky et al.

(10) Patent No.: US 9,515,683 B2
(45) Date of Patent: Dec. 6, 2016

(54) FORWARD ERROR CORRECTION ARCHITECTURE AND IMPLEMENTATION FOR POWER/SPACE EFFICIENT TRANSMISSION SYSTEMS

(71) Applicants: John P. Mateosky, West River, MD (US); Michael Y. Frankel, Baltimore, MD (US)

(72) Inventors: John P. Mateosky, West River, MD (US); Michael Y. Frankel, Baltimore, MD (US)

(73) Assignee: Ciena Corporation, Hanover, MD (US)

( * ) Notice: Subject to any disclaimer, the term of this patent is extended or adjusted under 35 U.S.C. 154(b) by 126 days.

(21) Appl. No.: 14/459,000

(22) Filed: Aug. 13, 2014

(65) Prior Publication Data

US 2016/0049964 A1    Feb. 18, 2016

(51) Int. Cl.
*H03M 13/29*    (2006.01)
*H03M 13/15*    (2006.01)

(52) U.S. Cl.
CPC ..... *H03M 13/2909* (2013.01); *H03M 13/1515* (2013.01)

(58) Field of Classification Search
CPC ................................................ H03M 13/2957
USPC .................................. 714/755, 763, 776, 789
See application file for complete search history.

(56) References Cited

U.S. PATENT DOCUMENTS

| | | | | |
|---|---|---|---|---|
| 6,184,942 B1* | 2/2001 | Patel | ........................ | H03D 1/24 |
| | | | | 348/558 |
| 7,668,257 B2* | 2/2010 | Limberg | ............. | H03M 13/253 |
| | | | | 375/269 |
| 9,124,383 B1* | 9/2015 | Frankel | ............... | H04J 14/0212 |
| 2004/0160692 A1* | 8/2004 | Kirby | ..................... | G11B 20/08 |
| | | | | 360/29 |
| 2009/0016432 A1* | 1/2009 | Limberg | ............... | H04L 65/607 |
| | | | | 375/240.01 |
| 2013/0227373 A1* | 8/2013 | Shen | ..................... | H03M 13/29 |
| | | | | 714/755 |

OTHER PUBLICATIONS

Scholten, et al., "Continuously-Interleaved BCH (CI-BCH) FEC delivers best in class NECG for 40G and 100G metro applications," OSA / ORC/NFOEC, 2010, pp. 1-3.
Ingale, Mangesh Abhimanyu, "Error Correcting Codes in Optical Communication Systems," Chalmers University of Technology, Jan. 2003, pp. 1-102.

* cited by examiner

*Primary Examiner* — Fritz Alphonse
(74) *Attorney, Agent, or Firm* — Clements Bernard PLLC; Christopher L. Bernard; Lawrence A. Baratta, Jr.

(57) ABSTRACT

A concatenated Forward Error Correction (FEC) code method, at an intermediate point, includes receiving, from an ingress point, a signal that is fully encoded with a concatenated FEC code, wherein the concatenated FEC code includes at least an inner code and an outer code; partially decoding the signal by decoding the inner code at the intermediate point; and transmitting the partially decoded signal towards an egress point where the partially decoded signal is fully decoded.

17 Claims, 6 Drawing Sheets

| Case 1: BERin = 1.5E-03, Span Count=4 | Case 2: BERin = 2.5E-03, Span Count = 4 |
|---|---|
| (Inner Decode) SPAN Count = 1, clean_dcd = 0<br>Total_Transmitted_Bits = 4.875600e+08<br>Total_Errored_Bits   = 7.325320e+05<br>Total_Corrected_Bits = 7.197770e+05<br>Uncorrected_Bits     = 1.275500e+04<br>Input_BER            = 1.502445e-03<br>Corrected_Output_BER = 2.616088e-05<br>Running_Errored_Bit_Count   = 12755.0<br>Running_Corrected_Output_BER = 2.616e-05 | (Inner Decode) SPAN Count = 1, clean_dcd = 0<br>Total_Transmitted_Bits = 4.875600e+08<br>Total_Errored_Bits   = 1.219216e+06<br>Total_Corrected_Bits = 1.047611e+06<br>Uncorrected_Bits     = 1.716050e+05<br>Input_BER            = 2.500648e-03<br>Corrected_Output_BER = 3.519669e-04<br>Running_Errored_Bit_Count   = 171605.0<br>Running_Corrected_Output_BER = 3.520e-04 |
| ((Inner Decode) SPAN Count = 2, clean_dcd = 0<br>Total_Transmitted_Bits = 4.875600e+08<br>Total_Errored_Bits   = 7.438000e+05<br>Total_Corrected_Bits = 7.153860e+05<br>Uncorrected_Bits     = 1.565900e+04<br>Input_BER            = 1.525556e-03<br>Corrected_Output_BER = 3.211707e-05<br>Running_Errored_Bit_Count   = 28414.0<br>Running_Corrected_Output_BER = 2.914e-05 | (Inner Decode) SPAN Count = 2, clean_dcd = 0<br>Total_Transmitted_Bits = 4.875600e+08<br>Total_Errored_Bits   = 1.389877e+06<br>Total_Corrected_Bits = 9.738790e+05<br>Uncorrected_Bits     = 2.443930e+05<br>Input_BER            = 2.850679e-03<br>Corrected_Output_BER = 5.012573e-04<br>Running_Errored_Bit_Count   = 415998.0<br>Running_Corrected_Output_BER = 4.266e-04 |
| (Inner Decode) SPAN Count = 3, clean_dcd = 0<br>Total_Transmitted_Bits = 4.875600e+08<br>Total_Errored_Bits   = 7.582930e+05<br>Total_Corrected_Bits = 7.119220e+05<br>Uncorrected_Bits     = 1.795700e+04<br>Input_BER            = 1.555281e-03<br>Corrected_Output_BER = 3.683034e-05<br>Running_Errored_Bit_Count   = 46371.0<br>Running_Corrected_Output_BER = 3.170e-05 | (Inner Decode) SPAN Count = 3, clean_dcd = 0<br>Total_Transmitted_Bits = 4.875600e+08<br>Total_Errored_Bits   = 1.634004e+06<br>Total_Corrected_Bits = 9.073330e+05<br>Uncorrected_Bits     = 3.106730e+05<br>Input_BER            = 3.351391e-03<br>Corrected_Output_BER = 6.371995e-04<br>Running_Errored_Bit_Count   = 726671.0<br>Running_Corrected_Output_BER = 4.968e-04 |
| (Inner Decode) SPAN Count = 4, clean_dcd = 0<br>Total_Transmitted_Bits = 4.875600e+08<br>Total_Errored_Bits   = 7.760460e+05<br>Total_Corrected_Bits = 7.092220e+05<br>Uncorrected_Bits     = 2.045300e+04<br>Input_BER            = 1.591693e-03<br>Corrected_Output_BER = 4.194971e-05<br>Running_Errored_Bit_Count   = 66824.0<br>Running_Corrected_Output_BER = 3.426e-05 | (Inner Decode) SPAN Count = 4, clean_dcd = 0<br>Total_Transmitted_Bits = 4.875600e+08<br>Total_Errored_Bits   = 1.946247e+06<br>Total_Corrected_Bits = 8.432450e+05<br>Uncorrected_Bits     = 3.763310e+05<br>Input_BER            = 3.991810e-03<br>Corrected_Output_BER = 7.718660e-04<br>Running_Errored_Bit_Count   = 1103002.0<br>Running_Corrected_Output_BER = 5.656e-04 |
| \*\*\* De-Interleave \*\*\* | \*\*\* De-Interleave \*\*\* |
| (Outer Decode) SPAN Count = 4, Clean Decode: 1:<br>Uncorrected_Bits     = 0.000000e+00<br>Corrected_Output_BER = 0.000000e+00<br>Total Running_Errored_Bit_Count   = 66824.0 | (Outer Decode) SPAN Count = 4 , Clean Decode: 0:<br>Uncorrected_Bits     = 3.774780e+05<br>Corrected_Output_BER = 7.742186e-04<br>Total Running_Errored_Bit_Count   = 3.774780e+05 |

FIG. 8

FORWARD ERROR CORRECTION ARCHITECTURE AND IMPLEMENTATION FOR POWER/SPACE EFFICIENT TRANSMISSION SYSTEMS

FIELD OF THE DISCLOSURE

The present disclosure relates generally to networking systems and methods. More particularly, the present disclosure relates to a novel forward error correction architecture and implementation for power/space efficient transmission systems.

BACKGROUND OF THE DISCLOSURE

Forward error correction (FEC) concatenated codes are used today in many facets of optical, satellite, and wireless communications systems as well as other systems like storage and SAN networks. Multi-dimensional codes are used today to increase the Net Effective Coding Gain (NECG) at the network termination point at the expense of hardware and system complexity at these points. The present state-of-the-art uses concatenated codes and other similar approaches to strictly increase coding gain at each termination point at the expense of added complexity. In certain optical network architectures, particularly metro access and metro oriented optical networks, and more specifically single hop regenerative metro and datacenter networks where optical-electrical-optical (OEO) conversion occurs at each node or network element (NE), limiting electronic functionality at these NEs becomes paramount to limit cost, power consumption, and footprint. A network architect can breakdown the NE a bit more and draw a distinction between an NE that requires client add/drop capability (some percentage of the overall bandwidth added/dropped to customer(s)), and NEs that do not, i.e. expressed traffic. In practice, most nodes end up being a hybrid, requiring both functions, network express and client add/drop. Similarly, in certain electrical circuit configurations such as ones that transmit signals across long electrical connections (i.e. backplanes, cables, etc. . . . ), a distinction can be drawn between circuits that originate and terminate data and ones that simply express it through.

However, increasing NECG, as is done with these FEC codes, results in increased cost, power, and space. It would be advantageous to continue to obtain the NECG provided by these FEC codes for the complete client to client connection, but to minimize the impact on increased cost, power, and space, especially at NEs with expressed traffic or the like.

BRIEF SUMMARY OF THE DISCLOSURE

In various exemplary embodiments, the present disclosure recognizes that concatenated FEC codes are essentially independent in operation and occupy separate real estate in circuitry and contribute to power consumption. The present disclosure proposes to functionally separate FEC codes into two components: Inner FEC that operates on every single span, and Outer FEC that operates only at the Client ingress/egress points. As is demonstrated herein, this configuration provides a substantial reduction in overall system FEC complexity and power consumption, while largely preserving the gain associated with the concatenated FEC arrangement.

In an exemplary embodiment, a concatenated Forward Error Correction (FEC) code method, at an intermediate point includes receiving, from an ingress point, a signal that is fully encoded with a concatenated FEC code, wherein the concatenated FEC code has at least an inner code and an outer code; partially decoding the signal by decoding the inner code at the intermediate point; and transmitting the partially decoded signal towards an egress point where the partially decoded signal is fully decoded. The transmitting is performed without re-encoding of the signal. The egress point can be configured to perform multiple passes to fully decode the partially decoded signal. The intermediate point can be one of a plurality of intermediate points in sequence between the ingress point and the egress point, and each of the plurality of intermediate points is configured to partially decode the signal by decoding the inner code. The concatenated FEC method can further include monitoring error counts based on the partial decoding. The signal can be fully encoded, at the ingress point, by encoding with the outer code, interleaving, and encoding with the inner code, and the signal can be fully decoded, at the egress point, by decoding the inner code, de-interleaving, and decoding the outer code. The method can be performed in an optical network where the ingress point is an add network element, the intermediate point can be an express network element performing optical-electrical-optical regeneration, and the egress point can be a drop network element. The inner code can be decoded at the intermediate point and any additional intermediate points in sequence between the ingress point and the egress point and the outer code is decoded once at a client egress point.

In another exemplary embodiment, a transmission system includes an express electronic circuit or network element with a partial decoder configured to receive a signal and to partially decode the signal by decoding an inner code, wherein the signal is fully encoded, by an ingress electronic circuit or network element, with a concatenated Forward Error Correction (FEC) code which includes the inner code and an outer code; wherein the express electronic circuit or network element is configured to transmit the partially decoded signal towards an egress electronic circuit or network element with a full decoder configured to fully decode the signal. The express electronic circuit or network element can be configured to retransmit the signal without re-encoding the signal. The transmission system can further include a plurality of express electronic circuits or network elements in sequence between the ingress electronic circuit or network element and the egress electronic circuit or network element, each of the plurality of express electronic circuits or network elements is configured to partially decode the signal by decoding the inner code of the signal. The express electronic circuit or network element can be configured to monitor error counts based on the partial decode. The ingress electronic circuit or network element can have a full encoder configured to fully encode the signal by encoding with the outer code, interleaving, and encoding with the inner code, and the egress electronic circuit or network element can have a full decoder configured to fully decode the signal by decoding the inner code, de-interleaving, and decoding the outer code. The transmission system can be an optical network with the express network element performing optical-electrical-optical regeneration. The inner code can be decoded at each intermediate point in sequence between the ingress electronic circuit or network element and the egress electronic circuit or network element, and the outer code can be decoded once at the egress electronic circuit or network element.

In yet another exemplary embodiment, an apparatus includes circuitry configured to receive a signal from a channel, wherein the signal is encoded with a concatenated Forward Error Correction (FEC) code with an inner code and an outer code; circuitry configured to perform a partial decode of the inner code; and circuitry configured to retransmit the partially decoded signal without re-encoding the signal. The apparatus can further include circuitry configured to monitor for errors based on the partial decode. The apparatus can be located in an express network element in a transmission system. The express network element can perform optical-electrical-optical regeneration of the signal while only partially decoding the concatenated FEC code. The apparatus can be any of an electronic circuit for data origination, electronic circuits for data regeneration and retransmission, and electrical interconnect lines.

BRIEF DESCRIPTION OF THE DRAWINGS

The present disclosure is illustrated and described herein with reference to the various drawings, in which like reference numbers are used to denote like system components/method steps, as appropriate, and in which:

FIG. 8 are two illustrative MATLAB model network simulation runs that provide some quantitative data for two different input BER rates for a four span network simulation.

DETAILED DESCRIPTION OF THE DISCLOSURE

In various exemplary embodiments, the present disclosure relates to a novel forward error correction architecture and implementation for power/space efficient optical transmission systems. This architecture and implementation focuses on reducing the cost, size, and power of electronic circuits associated with Forward Error Correction (FEC), while still maximizing the overall Net Effective Coding Gain (NECG) available to demand connections. FEC is an efficient way to achieve substantial increase in noise immunity, at a cost of electronic complexity. FEC adds check bits to the payload data that are used by the decoder to precisely identify the locations of errors, and to correct them. In order to increase the NECG of the total solution, a concatenation of FEC codes is frequently used. This operating principle is described herein. The key to the architecture and implementation is that concatenated codes are essentially independent in operation and occupy separate application specific integrated circuit (ASIC) real estate and contribute to power consumption. The architecture and implementation propose to functionally separate FEC codes into two or more components: Inner FEC that operates on intermediate points such as electrical circuit connections or OEO spans, including express sites, and Outer FEC that operates only at the data origination/termination or signal ingress/egress points. As demonstrated herein, this configuration provides a substantial reduction in overall system FEC complexity and power consumption, while largely preserving the NECG associated with the concatenated FEC arrangement.

In an exemplary embodiment, the proposed architecture, in optical network systems, allows Express NEs to be considerably simpler, lower latency, lower cost, and lower power consumption. All of the above are critical, particularly as total aggregate NE bandwidth continues to grow based on overall world-wide bandwidth demand growing/expanding at a rate greater than 30% CAGR. As next generation photonic technologies get deployed in the future, these concepts and technologies will be the tools that allow networks continue to keep up with the required bandwidth demand.

Figure 1:
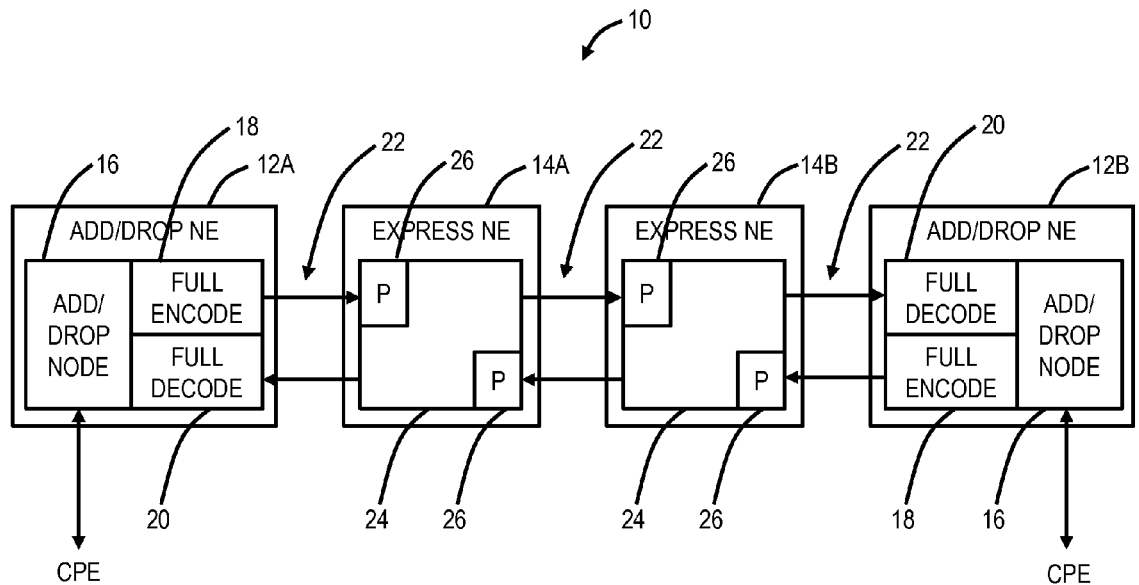
FIG. 1 is a network diagram of a network with three single hops between add/drop NEs and express NEs for an exemplary implementation of the novel forward error correction architecture.

Referring to FIG. 1, in an exemplary embodiment, a network diagram illustrates a network 10 with three single hops between add/drop NEs 12A, 12B and express NEs 14A, 14B. In an exemplary embodiment, the network 10 can be an optical network, although other physical transmission techniques are also contemplated. The network 10 illustrates a single bi-directional channel between the add/drop NEs 12A, 12B and expressed through the express NEs 14A, 14B. Of course, the network 10 can include multiple channels such as through wavelength division multiplexing (WDM) or the like. The add/drop NEs 12A, 12B provide ingress/egress of the single bi-directional channel to associated customer premises equipment (CPE). Specifically, the add/drop NEs 12A, 12B includes add/drop node equipment 16, full encode circuitry 18, and full decode circuitry 20. The add/drop node equipment 16 can include transceivers, modems, electrical circuitry, optical components, etc. to interface between the CPE and other NEs. The full encode circuitry 18 provides full forward error correction encoding as described herein, and the full decode circuitry 20 provides full forward error correction decoding as described herein. The add/drop NEs 12A, 12B and the express NEs 14A, 14B can include additional equipment which is omitted for simplicity of illustration.

There are channels 22 between each of the NEs 12A, 14A, 14B, 12B. For example, in an optical network, the channels 22 can be fiber optic cables. The channels 22 include the physical transmission of data with concatenated FEC thereon between the NEs 12A, 14A, 14B, 12B. The express NEs 14A, 14B are located between the add/drop NEs 12A, 12B and simply regenerate and retransmit the single bi-directional channel. The express NEs 14A, 14B include express node equipment 24 and partial decode circuitry 26. The express node equipment 24 can include transceivers, modems, electrical circuitry, optical components, etc. to interface between the different NEs over the channels 22. The partial decode circuitry 26 provides partial forward error correction decoding as described herein. Note, while described herein as a single bi-directional channel, the operations from the FEC perspective are independent between the two directions.

The single bi-directional channel includes a concatenated FEC for each direction. Concatenated FEC codes form a class of error-correcting codes that are derived by combining an inner code and an outer code. Specifically, both the outer code and the inner code are applied to the payload data at the client ingress point, at the full encode circuitry 18. Following fiber propagation or the like over the channel 22, each of the intermediate express NEs 14A, 14B applies only an inner decoder as a partial decode (PDEC) with the partial decode circuitry 26. It should be noted that at this point, analog noise is completely removed from the signal, but some residual uncorrected bit errors can remain. Performance monitoring can also be provided by measuring the PDEC error rate at this point in the network 10 for fault isolation. The signal entering the next span is not re-encoded. For example, a signal at the add/drop NE 12A is fully encoded, and only partially decoded at the express NE 14A. Following the next span, PDEC is again applied at the express NE 14B. At this point, the error rate is a linear combination of intrinsic span errors as well as additive bit errors from previous spans. The errors from previous spans are not added as noise, but simply as uncorrected bits. Noise induced-analog errors may be in the 1e-5 range, while residual bit errors from previous spans are likely to be in the 1e-12 range. Therefore, the uncorrected error accumulation would have only a small penalty on the overall link performance. Finally, at the add/drop NE 12B, the signal is fully decoded.

In an exemplary embodiment, a concatenated forward error correction code method includes fully encoding a signal with a concatenated forward error correction code, including an inner code and an outer code at an ingress point; partially decoding the concatenated forward error correction code by decoding the inner code at an intermediate point; and fully decoding the concatenated forward error correction code at an egress point. The concatenated forward error correction code method can further include retransmitting the signal from the intermediate point subsequent to the partially decoding, without re-encoding the signal. In another exemplary embodiment, a transmission system includes an ingress add/drop network element including a full encoder for encoding a signal with a concatenated forward error correction code including an inner code and an outer code; an express network element receiving the signal from the ingress add/drop network element and including a partial decoder for partially decoding the concatenated forward error correction code by decoding the inner code of the signal; and an egress add/drop network element including a full decoder for fully decoding the signal with the concatenated forward error correction code. The express network element is configured to retransmit the signal subsequent to the partially decoding without re-encoding the signal.

The partial decode circuit 26 can include circuitry receiving a signal from a channel, wherein the signal is encoded with a concatenated forward error correction code, including an inner code and an outer code; circuitry partially decoding the concatenated forward error correction code in the signal with the inner code; and circuitry retransmitting the signal subsequent to the circuitry partially decoding without re-encoding the signal. The partial decode circuit 26 can further include circuitry for monitoring errors based on the circuitry partially decoding the concatenated forward error correction code in the signal with the inner code.

The novelty of the architecture and implementation is to recognize that the encoding and decoding of the concatenated FEC outer and inner codes do not have to be present at the same physical locations or points in the system, e.g., the network 10 or the like. As a matter of fact, at practical low BER rates, nearly all coding gain associated with the addition of the outer code can be realized with only a single location or point of the outer code at the signal in/egress points, i.e., the add/drop NEs 12A, 12B. As described herein, points are referred to as locations where the FEC is encoded or decoded, namely an ingress point, one or more intermediate points, and an egress point. The points can physically be realized as circuitry performing the encoding or decoding. Another substantial novelty is that errors associated with signals traversing either electrical backplanes or optical interconnects inside the express sites are also effectively corrected through the PDEC. This is of critical importance as it eliminates the need for additional FEC codes that may be deployed in this portion of the system. It should be further emphasized that these internal express site connections can now run with substantially more noise, possibly down to $10^{-4}$ BER instead of the more customary $10^{-12}$. This corresponds to gaining ~5 dB of extra interconnect margin, at essentially zero cost and power premium.

The inner FEC decoders located at each intermediate express site still provide the required error monitoring metrics to identify potential network problems, and to provide whatever error-count based feedback loop controls are required at the express NEs 14A, 14B. The savings in power and complexity increase as the relative number of intermediate express sites increases, with ~50% savings expected at the network level. Intermediate span design rules follow the same rules as if full concatenated coding was performed on each individual span (with a negligible ~0.01 dB offset). Also, a factor of two reduction in overall, end-to-end, system latency is realized since the novel architecture requires only half of the decoders when compared to the traditional system architecture (with full decoding at every site).

Figure 2:
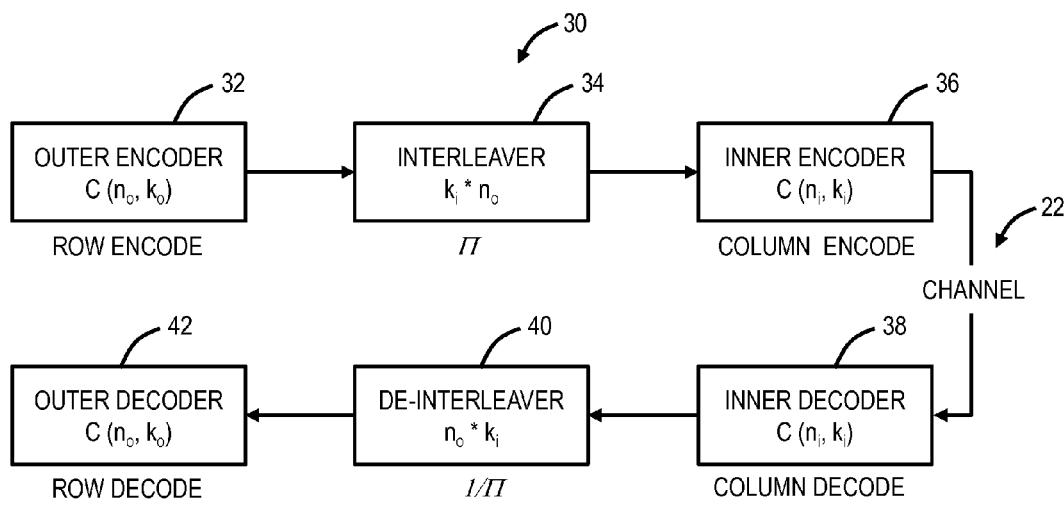
FIG. 2 is a block diagram of a Serially Concatenated Block (SCB) FEC Codec with an Interleaver (Π)

Referring to FIG. 2, in an exemplary embodiment, a block diagram illustrates a Serially Concatenated Block (SCB) FEC Codec 30 with Interleaver (Π). The FEC Codec 30 includes an outer encoder 32, an interleaver 34, an inner encoder 36, an inner decoder 38, a de-interleaver 40, and an outer decoder 42. The channel 22 is located between the inner encoder 36 and the inner decoder 38. The outer encoder 32 and the outer decoder 42 operate a code, $C(n_o, k_o)$, and the inner encoder 36 and the inner decoder 38 operate a code, $C(n_i, k_i)$. The interleaver 34 and the de-interleaver 40 support interleaving to support improvement against burst errors. The interleaver 34 performs $k_i * n_o$ interleaving and the de-interleaver 40 performs $n_o * k_i$ de-interleaving. The full encode circuitry 18 can include the outer encoder 32, the interleaver 34, and the inner encoder 26. The full decode circuitry 20 can include the inner decoder 38, the de-interleaver 40, and the outer decoder 42. The partial decode circuitry 26 can simply include the inner decoder 38.

Figure 3:
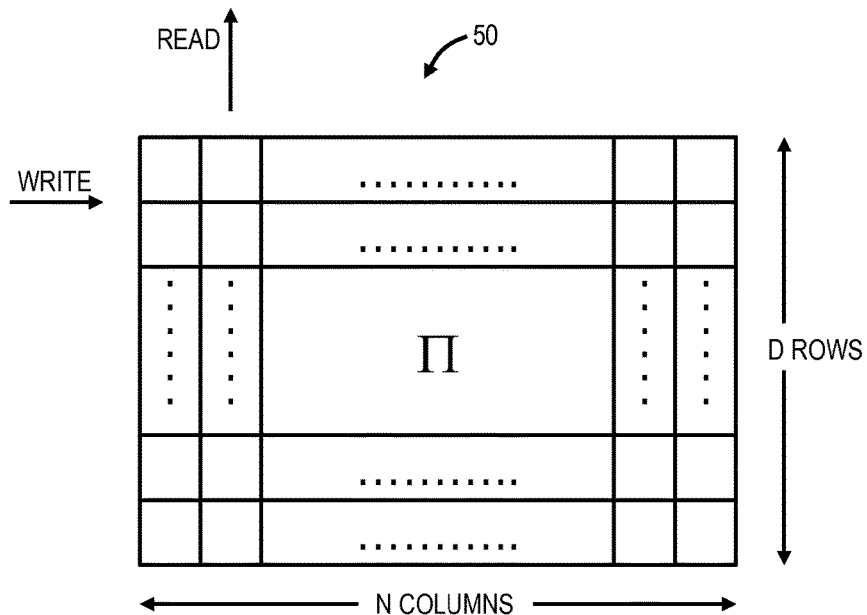
FIG. 3 is a block diagram of a row/column interleaver (Π)

Referring to FIG. 3, in an exemplary embodiment, a block diagram illustrates a row/column interleaver (Π) 50. The interleaver 34 can utilize the row/column interleaver (Π) 50 whereas the de-interleaver 40 can perform the opposite of the row/column interleaver (Π) 50. Here, the row/column interleaver (Π) 50 has N columns and D rows. Data is written to the columns and read from the rows.

Figure 4:
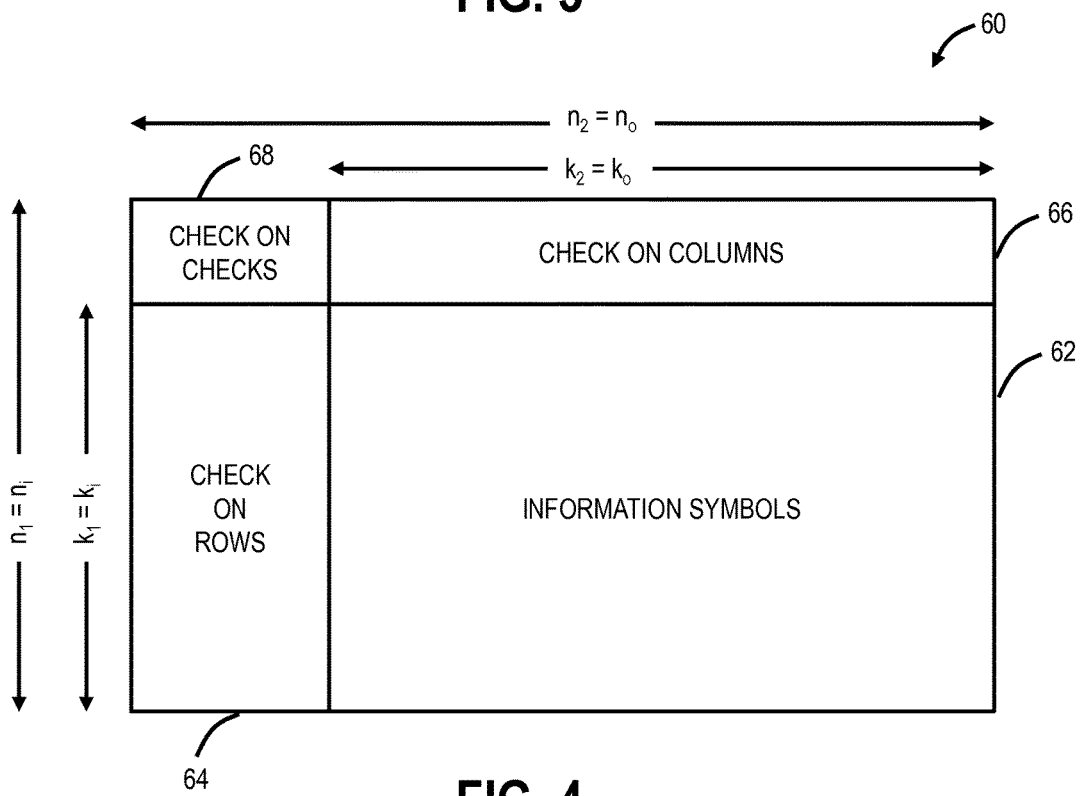
FIG. 4 is a block diagram of an SCB code construction.

Referring to FIG. 4, in an exemplary embodiment, a block diagram illustrates an SCB product code construction 60. The SCB product code construction 60 includes information symbols 52 which have $k_1$ rows (inner) and $k_2$ columns (outer), and $k_1 = k_i$ and $k_2 = k_o$. The SCB product code construction 60 also includes a check on rows 64, a check on columns 66, and a check on checks 68. The overall SCB product code construction 60 has $n_1$ rows (inner) and $n_2$ columns (outer), and $n_1 = n_i$ and $k_2 = k_o$. Note, from a terminology perspective, the SCB product code construction 60 is illustrated logically in rows and columns, with the rows representing the inner coding and the columns representing the outer coding, for illustration purposes.

In an exemplary embodiment, RS(255, 239), $n_1 =$ "$n_i$" or "n-inner" with a value of 255 and $k_1 =$ "$k_i$" or "k-inner" with a value of 239 in the FIG. 4. This corresponds to the inner CODEC, $C(n_1, k_1)$, performed $n_2$ times on the interleaver's columns after the (n,k) row data is computed. Similarly, $n_2$="$n_o$" or "n-outer" also with a value of 255 and $k_2$="$k_o$" or "k-outer" with value of 239 in the embodiment and corresponds to the outer CODEC C(n2,k2) operating on the matrix rows, k1 times. This exemplary embodiment's product code (a serially concatenated code), $C_1 \times C_2$ is constructed in the following order, and as follows:

1) Place ($k_1 * k_2$) info symbols in a 2-D matrix in this case, with $k_1$ rows and $k_2$ columns;
2) Code the $k_1$ rows using CODEC $C_2$, i.e. the outer CODEC C($n_2,k_2$) this is performed $k_1$ times on matrix rows; and
3) Code $n_2$ columns using CODEC $C_1$, i.e. the inner CODEC C($n_i,k_1$), this is performed $n_2$ times on the matrix columns.

The present disclosure contemplates use with any concatenated code such as product codes or the like. Specifically, the present disclosure contemplates use with Serially Concatenated Block Code (SCBC), Parallel Concatenated Block Code (PCBC), Serially Concatenated Convolutional Code (SCCC), Parallel Concatenated Convolutional Code (PCCC), Block Turbo Code (BTC), and the like.

Turbo codes can also be achieved by the serial and parallel concatenation of two (or more) constituent codes, that can be block or convolutional in nature. CTC is a convolutional turbo code, and BTC is a block turbo code also known as a TPC or turbo product code. A TPC has all three of the following characteristics: 1) utilizes only block codes as the constituent codes; 2) utilizes soft decision, iterative decoding; and 3) encoder and decoders use interleavers or permuted versions of the same information blocks.

Figure 5:
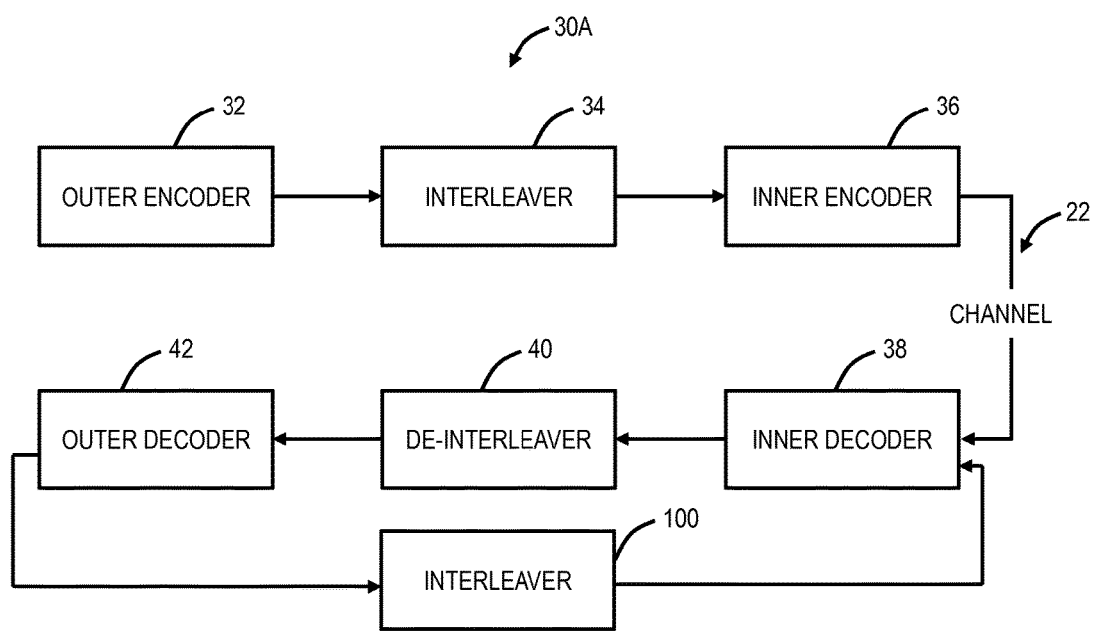
FIG. 5 is a block diagram of the SCB FEC Codec of FIG. 2 with an additional interleaver to support iterative decoding.

It is important to note that concatenated codes provide an increased coding gain, but only with a linear increase in hardware cost/complexity. Performance is further enhanced by using iteration, by performing multiple passes through the decoder complex, at no additional hardware cost (except possibly a small increase in memory per iteration), but instead increasing system latency linearly based on the number of iteration passes. This is illustrated in FIG. 5 where the FEC Codec 30 from FIG. 2 is illustrated as a FEC Codec 30A with an additional interleaver 100 between the outer decoder 42 and the inner decoder 38 to support iterative decoding.

It should be noted that an exemplary embodiment uses a concatenated Reed-Solomon Code: RS(255, 239)×RS(255, 239), with the base code being a linear, non-binary, cyclic block code, but in no way are these features a requirement or a restriction. Many, many combinations are available in serial (or parallel) concatenated codes, various multi-dimensional coding schemes built out of binary or non-binary codes, block or convolutional codes, cyclic or non-cyclic codes, etc. The RS(255,239) was chosen for the exemplary embodiment because of how ubiquitous and well understood the base code is in the industry, also for its simplicity and relatively low complexity as a hard decision block code, while still providing reasonable and useful coding gain for both electrical interconnects and metro-reach optical networks today. Note that complexity for an RS(255,239) encoder at the 10 Gbps optical link rate is ~20K ASIC gates, and the 10 G decoder is ~10× the encoder, or ~200K ASIC gates, both are quite small in relative terms when compared to other hard decision block codes.

Figure 6:
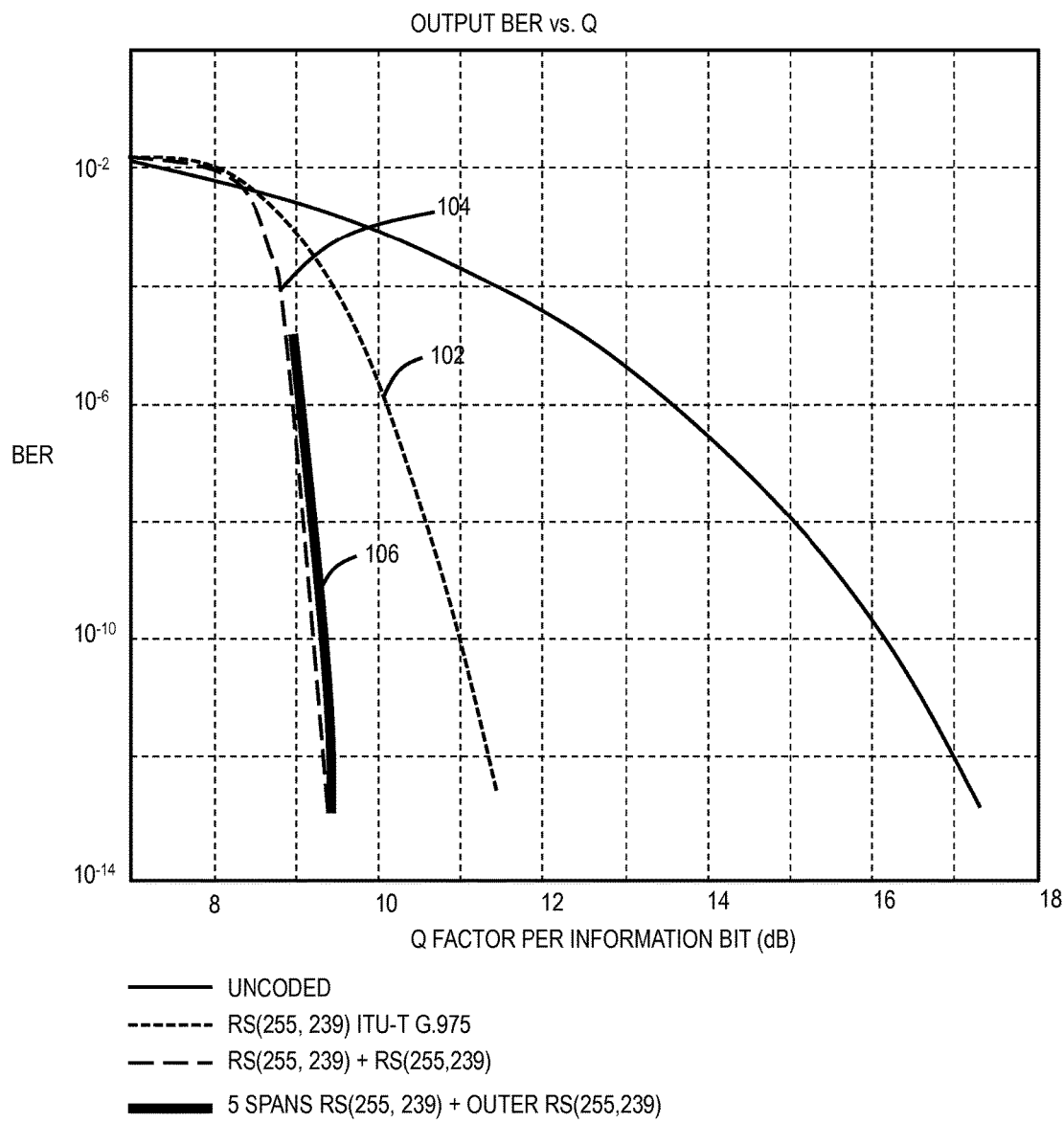
FIG. 6 is a graph of data transmission characteristics of various different coding techniques including the partial decoding described herein.

Referring to FIG. 6, in an exemplary embodiment, a graph illustrates data transmission characteristics of various different coding techniques including the partial decoding described herein. Un-coded performance is specified for an ideal on-off keying (OOK) channel, without FEC overhead. A curve 102 show FEC coded performance with a single RS(255,239) code, and a curve 104 shows FEC coded performance with a concatenation of two RS(255,239) codes. A curve 106 shows computed performance for the proposed configuration described herein with PDEC, with 5 spans of RS(255,239) Inner decoding, and a single Outer RS(255,239) code. The penalty for not doing the full concatenated decoding on each span is ~0.15 dB at $10^{-9}$ BER, but drops to ~0.01 dB at $10^{-15}$ BER.

The following table illustrates a performance comparison of the Various Hard Decision Concatenated Codes with Iteration:

| Code | Serially Concatenated RS(255,239) + RS(255,239) | | Concatenated BCH(2040,1930) + BCH(3860,3824) | | Concatenated with Continuous Interleaver BCH(1020,988) + BCH(1020,988) ** Scholten, et. al., from OFC2010 paper NTuB3: "CI-BCH FEC delivers best in class NECG for 40/100G Metro applications" | |
|---|---|---|---|---|---|---|
| Redundancy ratio | 13.83% | | 6.69% | | 6.69% | |
| Number of iterations | 1 | 2 | 2 | 3 | Min: (65 kbits) | Max: (1 Mbits) |
| NCG at $10^{-12}$ of output BER | 7.9 dB | 8.1 dB | 7.9 dB | 8.0 dB | 4.0 dB, estimated | 8.3 dB |
| NCG at $10^{-15}$ of output BER | 8.7 dB | 8.9 dB | 8.9 dB | 9.0 dB | 4.3 dB | 9.3 dB |

Figure 7:
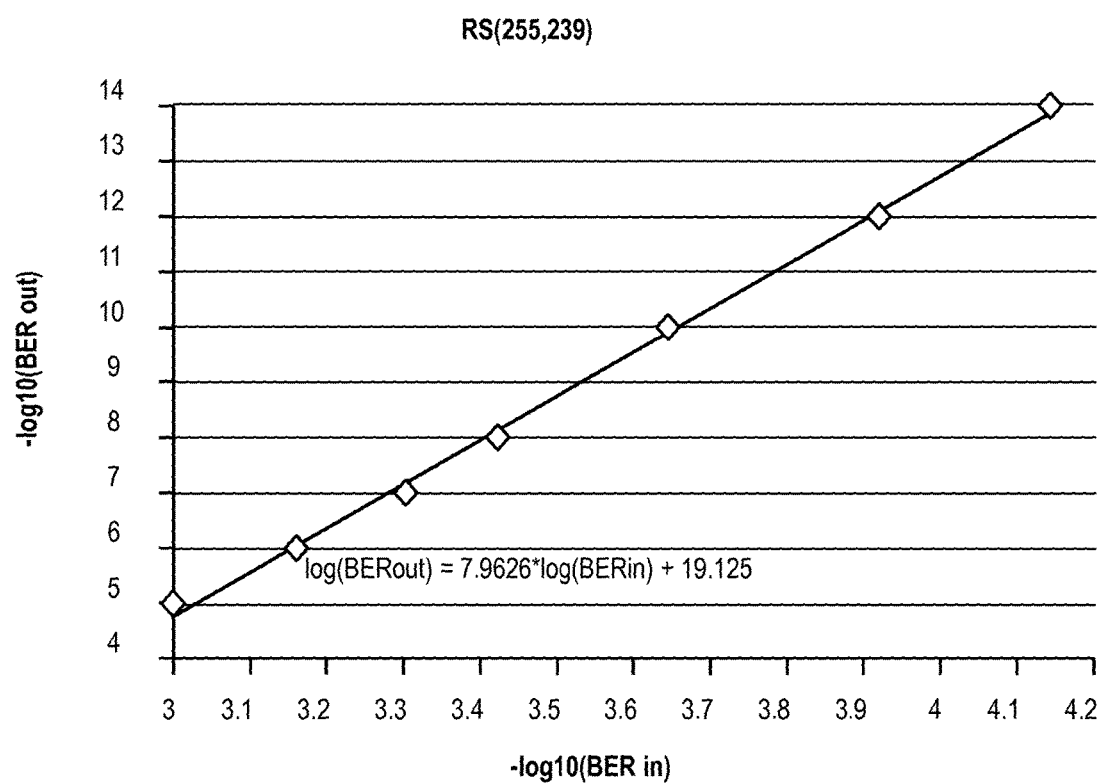
FIG. 7 is a graph of the analytic transfer characteristic between BER at input and BER for the chosen example RS(255,239) code.

FIG. 7 is a graph of the analytic transfer characteristic between BER at input and BER for the chosen example RS(255,239) code, namely $\log(\text{BER}_{out})=7.9626*\log(\text{BER}_{in}) 19.125$. The computation of the coding performance (the curve 106 in FIG. 9) uses this transfer characteristic. The following example computation shows how error rates evolve as the signal propagates from the ingress to egress points, through 5 spans with 4 intermediate Express units. "BERspan" indicates that every span can operate at ~$10^{-192}$ intrinsic error rate, while overall system still decodes to $10^{-9}$ BER.

| −log(BERspan) -> 2.918376343 | | |
|---|---|---|
| Span | −log($\text{BER}_{in}$) | −log($\text{BER}_{out}$) |
| Ingress | | 99.0000000 |
| Regenerator 1 | 2.918376343 | 4.1128635 |
| Regenerator 2 | 2.891474812 | 3.8986573 |
| Regenerator 3 | 2.875153562 | 3.7686978 |
| Regenerator 4 | 2.861033891 | 3.6562685 |
| Inner Egress | 2.845444672 | 3.5321377 |
| Outer Egress | 3.532137744 | 9.0000000 |

The key benefit of the architecture and implementation described herein is the ability it gives a network architect and designer to drop node power and complexity at intermediate express NEs in a regenerative, single-hop, optical network. By not having to include the full product code elements, the overall complexity drops by more than half while also reducing system latency.

Specifically, as overall network node bandwidth continues to increase, assume a node with 3.2 Tb/s, or 32 bi-directional channels of 100 G line capacity as an illustrative example. Power Assumptions in the following table are based on actual 100 G (OTU4 GFEC) power measurements, implemented in an 22 nm Field Programmable Gate Array (FPGA), i.e. 100 G implementation of RS(255,239) Codec at 1.5 W per decoder, 0.5 W per encoder:

|  | Complexity | Power (Watts) |
| --- | --- | --- |
| 100G Tributaries: RS(255,239) Express NE (2 × Decoders per Bi-Directional channel only) | 2 × RS(255,239) Decoders | 1.5 × 2 → 3.0 W (1 ch express, outer FEC only) |
| 100G Tributaries: RS(255,239) × RS(255,239) Add/Drop NE (4 × (Decoder + Encoder) per Bi-Directional Product Code Channel) | 4 Encoders + 4 Decoders | (0.5 + 1.5) × 4 → 8.0 W (1 ch add/drop, concatenated FEC) |
| 32 Channel Express NE | 64 Decoders | 32 × 3 W → 96 W |
| 32 Channel Add/Drop NE | 64 Encoders + 64 Decoders | 64 × (0.5 + 1.5)W → 128 W |
| 5-Span (6 Add/Drop NEs) 32 Channel System | 768 Encoders + 768 Decoders | 1536 W, conventional approach |
| 5-Span (2 Add/Drop + 4 Express NEs) 32 Channel System | 128 Encoders + 384 Decoders | 640 W, Proposed Architecture *58% System Power and Electronic Complexity Savings |

The bottom line is that the proposed architecture saves ~50% of the cost and complexity associated with concatenated FEC coding, at the expense of a negligible (~0.01 dB at $10^{-15}$ BER) performance penalty. Another way of looking at the performance is gaining ~2 dB of additional NECG per span, at an expense of only 20% increase in FEC power consumption and complexity.

FIG. 8 are two illustrative MATLAB model network simulation runs that provide some quantitative data for two different input BER rates for a four span network simulation. In particular, numeric simulations are performed to make sure that bit error accumulation across multiple spans follows a pseudo-random patterns, and does not cause any unexpected FEC decoding issues. At the ingress node the signal is encoded via the RS(255,239)+RS(255,239) product code. It is important to note that this is the only time encoding for row and column blocks occurs.

The first three OEO termination points only perform an inner decode as would be done at all network express traffic nodes. In this simulation the fourth and final NE is the drop-site node, at this point both row and column decoding is performed, the system design needs to allow the add/drop site's maximal coding gain to clean up any residual errors incurred and accumulated during the preceding express sites, including any system margin.

Note that in Case 1, with an overall input BER of 1.5E-03 the system sustained dribbling errors at each Express NE (nodes 1 through 3), where only row decoding was being performed, but overall the input BER was sufficiently low such that the final Add/Drop NE (node 4), which performed both row and column decoding with a row/column interleaver stage, these residual errors were fully cleaned up prior to client add/drop. Case 2 illustrates the case where the input BER was too high for the final add/drop node to fully clean up all of the accumulated errors from each of the subsequent NEs.

It will be appreciated that some exemplary embodiments described herein may include one or more generic or specialized processors ("one or more processors") such as microprocessors, digital signal processors, customized processors, and field programmable gate arrays (FPGAs) and unique stored program instructions (including both software and firmware) that control the one or more processors to implement, in conjunction with certain non-processor circuits, some, most, or all of the functions of the methods and/or systems described herein. Alternatively, some or all functions may be implemented by a state machine that has no stored program instructions, or in one or more application specific integrated circuits (ASICs), in which each function or some combinations of certain of the functions are implemented as custom logic. Of course, a combination of the aforementioned approaches may be used. Moreover, some exemplary embodiments may be implemented as a non-transitory computer-readable storage medium having computer readable code stored thereon for programming a computer, server, appliance, device, etc. each of which may include a processor to perform methods as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer readable medium, software can include instructions executable by a processor that, in response to such execution, cause a processor or any other circuitry to perform a set of operations, steps, methods, processes, algorithms, etc.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A concatenated Forward Error Correction (FEC) code method, implemented in electronic circuitry or a network element at an intermediate point associated with transmission of a signal, the method comprising:

receiving, from an ingress point, the signal that is fully encoded with a concatenated FEC code, wherein the concatenated FEC code has at least an inner code and an outer code;

partially decoding the signal by decoding the inner code at the intermediate point; and transmitting the partially decoded signal towards an egress point where the partially decoded signal is fully decoded.

2. The concatenated FEC method of claim 1, wherein the transmitting is performed without re-encoding of the signal.

3. The concatenated FEC method of claim 1, wherein the egress point is configured to perform multiple passes to fully decode the partially decoded signal.

4. The concatenated FEC method of claim 1, wherein the intermediate point is one of a plurality of intermediate points in sequence between the ingress point and the egress point, and each of the plurality of intermediate points is configured to partially decode the signal by decoding the inner code.

5. The concatenated FEC method of claim 1, further comprising:

monitoring error counts based on the partial decoding.

6. The concatenated FEC method of claim 1, wherein the signal is fully encoded, at the ingress point, by encoding with the outer code, interleaving, and encoding with the inner code, and wherein the signal is fully decoded, at the egress point, by decoding the inner code, de-interleaving, and decoding the outer code.

7. The concatenated FEC method of claim 1, wherein the method is performed in an optical network where the ingress point is an add network element, the intermediate point is an express network element performing optical-electrical-optical regeneration, and the egress point is a drop network element.

8. The concatenated FEC code method of claim 1, wherein the inner code is decoded at the intermediate point and any additional intermediate points in sequence between the ingress point and the egress point and the outer code is decoded once at a client egress point.

9. A transmission system, comprising:

an express electronic circuit or network element with a partial decoder configured to receive a signal and to partially decode the signal by decoding an inner code, wherein the signal is fully encoded, by an ingress electronic circuit or network element, with a concatenated Forward Error Correction (FEC) code which includes the inner code and an outer code; and one or more express electronic circuits or network elements in sequence between the ingress electronic circuit or network element and the egress electronic circuit or network element, wherein each of the one or more express electronic circuits or network elements is configured to partially decode the signal by decoding the inner code of the signal, wherein the express electronic circuit or network element is configured to transmit the partially decoded signal towards an egress electronic circuit or network element with a full decoder configured to fully decode the signal.

10. The transmission system of claim 9, wherein the express electronic circuit or network element is configured to retransmit the signal without re-encoding the signal.

11. The transmission system of claim 9, wherein the express electronic circuit or network element is configured to monitor error counts based on the partial decode.

12. The transmission system of claim 9, wherein the ingress electronic circuit or network element has a full encoder configured to fully encode the signal by encoding with the outer code, interleaving, and encoding with the inner code, and wherein the egress electronic circuit or network element has a full decoder configured to fully decode the signal by decoding the inner code, de-interleaving, and decoding the outer code.

13. The transmission system of claim 9, wherein the transmission system is an optical network with the express network element performing optical-electrical-optical regeneration.

14. The transmission system of claim 9, wherein the inner code is decoded at each intermediate point in sequence between the ingress electronic circuit or network element and the egress electronic circuit or network element and the outer code is decoded once at the egress electronic circuit or network element.

15. An apparatus, comprising:

circuitry configured to receive a signal from a channel, wherein the signal is encoded with a concatenated Forward Error Correction (FEC) code with an inner code and an outer code;

circuitry configured to perform a partial decode of the signal; and circuitry configured to retransmit the partially decoded signal without re-encoding the signal, wherein the apparatus is located in an express network element in a transmission system, wherein the express network element performs optical-electrical-optical regeneration of the signal though only partially decoding the concatenated FEC code.

16. The apparatus of claim 15, further comprising:

circuitry configured to monitor for errors based on the partial decode.

17. The apparatus of claim 15, wherein the apparatus is any of an electronic circuit for data origination, electronic circuits for data regeneration and retransmission, and electrical interconnect lines.

\* \* \* \* \*